United States Patent [19]

Hughes

[11] 4,283,796

[45] Aug. 11, 1981

[54] PORTABLE DEVICE WITH HOUSING FOR BATTERY AND PLUG-IN MODULE

[75] Inventor: Mark F. Hughes, Ft. Lauderdale, Fla.

[73] Assignee: Motorola, Inc., Schaumburg, Ill.

[21] Appl. No.: 144,134

[22] Filed: Apr. 28, 1980

[51] Int. Cl.³ .......................... H04B 1/08; H05K 7/00
[52] U.S. Cl. ................................... 455/349; 455/351; 361/392; 361/422
[58] Field of Search ................. 455/90, 128, 348, 349, 455/347, 351; 361/392, 395, 422

[56] References Cited

U.S. PATENT DOCUMENTS

| | | | |
|---|---|---|---|
| 3,077,563 | 2/1963 | Combs et al. | 455/348 |
| 4,012,672 | 3/1977 | Douglass et al. | 455/349 |
| 4,131,851 | 12/1978 | Martiny et al. | 455/349 |
| 4,177,426 | 12/1979 | Gaishin et al. | 361/392 |

FOREIGN PATENT DOCUMENTS 2810500 9/1979 Fed. Rep. of Germany ........... 455/347

*Primary Examiner*—Jin F. Ng
*Attorney, Agent, or Firm*—Donald B. Southard; James W. Gillman

[57] ABSTRACT

Portable device, such as a radio pager, having a battery housing or retainer accessible from outside the housing, and a socket for a plug-in module for controlling the device to be inserted through the battery opening. The plug-in module can be a code plug which cooperates with a decoder chassis for controlling the particular code for the device. The decoder chassis is provided on a main chassis connected to the battery retainer, and is held in position by the retainer when the code plug is inserted into or extracted from the socket on the decoder chassis. The decoder chassis can include a semiconductor die having circuits suitable for use in a plurality of different coding schemes. An opening in the battery retainer provides a passage for laser programming of the die through the battery opening after the device is completely assembled and in operative condition.

9 Claims, 3 Drawing Figures

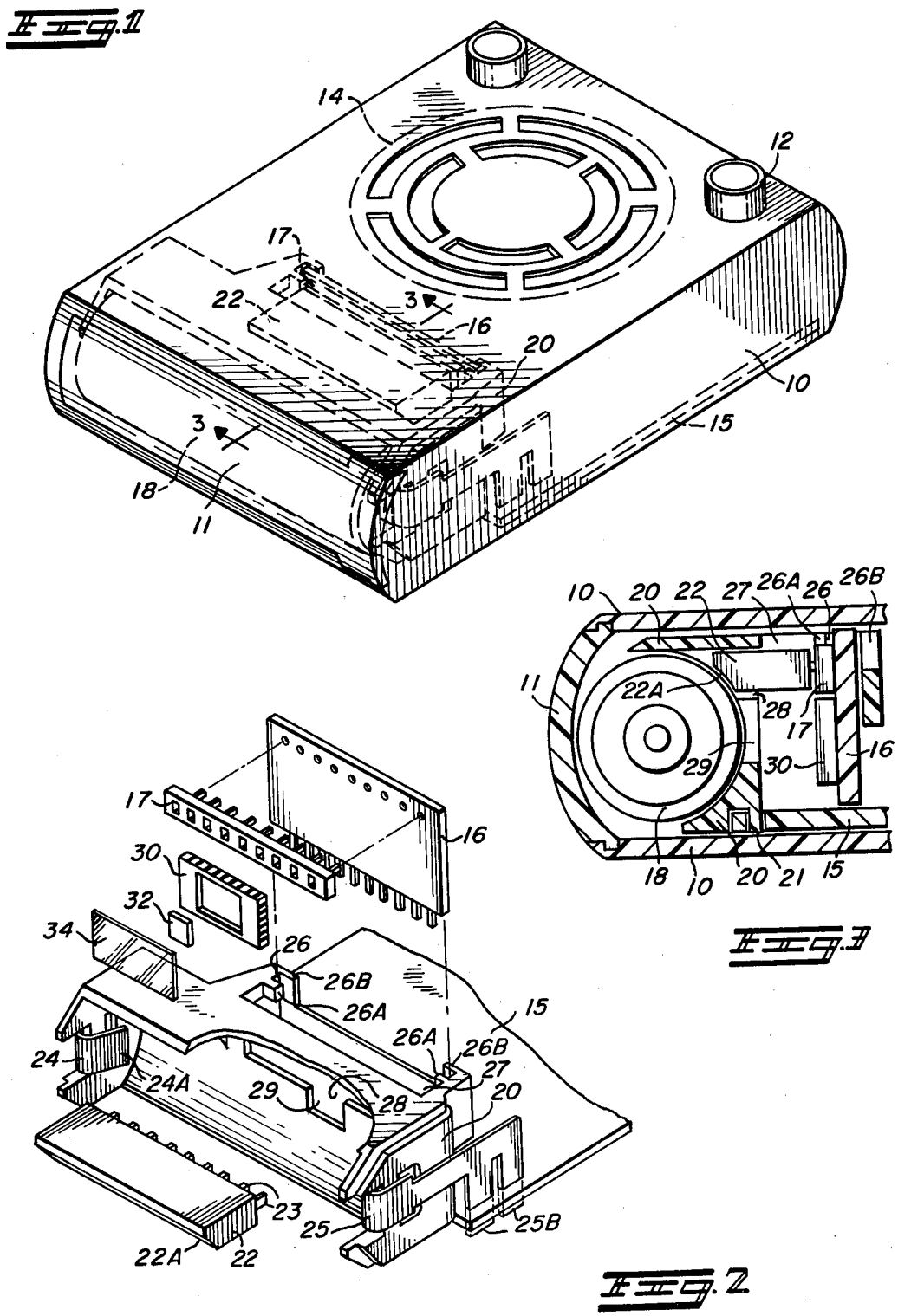

PORTABLE DEVICE WITH HOUSING FOR BATTERY AND PLUG-IN MODULE

BACKGROUND OF THE INVENTION

Portable electronic devices, such as a radio pager or a remote control unit which are in common use, require a decoder or coder which is unique to a particular code signal. Such devices are provided in a housing which contains the electronic components and a battery for energizing the same which can be replaced through an opening in the housing. The decoder (or coder) may include a code plug having the elements to condition the decoder for response to the individual code. In prior devices, it has been necessary to open the housing to set the decoder for a particular code, as by inserting a code plug or by making particular connections, switch settings, or the like. This is objectionable as such access to the components of the device by the user has caused problems when the user has attempted to adjust the device without having adequate knowledge of the same. It is, therefore, desired to be able to change the code for the device without disassembly of the same. Also, it may be desired to change the mode of operation of the decoder (or coder) for use in various coding elements. However, this cannot be easily accomplished in presently known devices.

It has been proposed to provide a slot or opening in the housing of a device for insertion of a plug-in control module, but this is objectionable in a small portable device which is subject to relatively rough outdoor usage. This may allow the entry of foreign material which can interfere with proper operation of the device and cause deterioration thereof.

SUMMARY OF THE INVENTION

It is an object of the present invention to provide a portable electronic device having an energizing battery within a housing which has an opening with a removable cover for access to the battery, wherein a module can be inserted into the circuit of the device and extracted therefrom through the battery access opening.

Another object is to provide a portable device having a battery and opening in the housing for access to the battery, with a coding chassis in the housing having a circuit programmable for use in different coding schemes which is laser programmable through the access opening after the device is completely assembled and in operative condition.

A further object of the invention is to provide a portable remote control electronic device having a coding chassis and an energizing battery, with a retainer for the battery which engages the chassis and is positioned so that a removable control module is insertable through the retainer into engagement with the chassis, with the chassis being held by the retainer during insertion and extraction of the module.

A still further object is to provide a radio paper having a housing with a battery retainer therein and an opening for placing a battery therethrough, wherein the pager has a decoder chassis adapted to receive a plug-in code plug, with the retainer mechanically engaging the chassis to limit movement of the same when the code plug is plugged into and extracted from the decoder chassis.

In accordance with the invention, a portable device such as a radio pager or a remote control unit has a battery retainer within the housing into which a battery can be placed through an opening in the housing. A removable cover is provided for the battery opening in known manner. The device includes a main chassis within the housing and a coding chassis, which may be a coder or a decoder, secured to the main chassis. The coding chassis has a socket thereon for receiving a plug-in control module or code plug which controls the code for a particular device. The battery retainer is positioned in mechanical engagement with the coding chassis and has an opening into which the control module can be placed when it is inserted into the socket. The retainer holds the coding chassis so that it does not move substantially when the module is inserted into or extracted from the chassis. The coding chassis can be perpendicular to the main chassis to facilitate insertion of the control module through the battery opening and the battery retainer into operative position, so that the module can be changed without disassembly of the device. The coding chassis can include a die which is programmable for use in various coding schemes, and can be programmed by use of a laser beam which passes through the battery opening and battery retainer to the die. Thus, the coding chassis can be programmed after the device is completely assembled and in operative condition.

BRIEF DESCRIPTION OF THE DRAWINGS

FIG. 1 is a perspective view of a radio pager constructed in accordance with the invention;

FIG. 2 is an exploded view illustrating parts of the structure of the invention; and FIG. 3 is a cross-sectional view along the lines 3—3 of FIG. 1.

DETAILED DESCRIPTION OF THE DRAWING

FIG. 1 shows a radio pager which incorporates the invention, including a housing 10 having controls 12 thereon and a grill 14 through which audio signals pass from a speaker within the housing. Inside the housing 10 is a main chassis 15, which may include a printed circuit board, and a decoder chassis 16 which extends perpendicularly from the main chassis 15. Other components are also connected on the main chassis 15 in known manner. A battery 18 for energizing the pager is provided within the housing 10 and can be placed therein and removed therefrom through an opening which is closed by cover 11. The cover may be slidably retained on housing 10 or secured thereto in any other known way. A battery housing or retainer 20 is provided within the housing 10 for holding the battery 18 and making connections thereto. The retainer 20 is secured to the main chassis 15 and has portions surrounding the decoder chassis 16. A plug-in module 22 forms a code plug which is insertable through the battery opening in housing 10 and through an opening in retainer 20 into engagement with a socket 17 provided on the decoder chassis 16.

FIGS. 2 and 3 show the construction of the battery retainer 20 and the decoder chassis 16 and the cooperation therebetween and with the code plug 22. The retainer 20 has lugs 21 extending therefrom into openings in the main chassis board 15 which have an interference fit for a secure mechanical connection. One lug 21 is shown in FIG. 3, but two or more lugs can be provided across the width of the retainer 20 and circuit board 15. Conducting strips 24 and 25 are provided on the retainer 20 for making electrical connections from the battery 18 to the circuit board 15. The strips have spring ends (24A) for engaging the battery terminals and projections (25B) which extend through openings in the chassis board 15 and may be soldered to conductors on the bottom side thereof. It will be clear that the strip 25 also has a spring end, and that the strip 24 has a projection extending through the chassis board 15, which are not shown. The projections on the strips 24 and 25 further help to hold the retainer 20 securely connected to the circuit board 15.

The battery retainer 20 has portions forming a slot 26 therein for receiving the decoder chassis 16. After the decoder chassis 16 is positioned on and connected to the main chassis 15, the retainer 20 can be moved down about the decoder chassis 16 into engagement with the chassis 15. Portions 26A and 26B of the retainer 20, which are on opposite sides of the slot 26, prevent movement of the decoder chassis 16 perpendicular to its plane. The retainer 20 also has a second slot 28 receiving the code plug or module 22 so that the conducting pins 23 thereon can be inserted into the socket 17. A tool can be provided for holding the module 22 to facilitate insertion and extraction thereof. The retainer 20 prevents substantial movement of chassis 16 and socket 17 when the code plug 22 is inserted into or extracted from the socket 17. The code plug 22 has a slanted edge 22A to provide clearance for the battery 18 and provides orientation, i.e., prevents backward, upside down insertion of code plug. The battery, when in position in the retainer 20, prevents the code plug 22 from being accidentally disengaged from the socket 17 in the event the pager is dropped or otherwise jolted. The code plug 22 can control the code to which a particular pager will respond, and by changing the code plug 22, the pager can be conditioned to respond to a different desired code.

As shown in FIGS. 2 and 3, the decoder chassis 16 has a chip carrier 30 mounted thereon, which in turn supports a decoder die 32. The carrier 30 and die 32 are covered by a glass cover 34 to exclude foreign material therefrom. The carrier 30, die 32 and cover 34 can be assembled on the chassis 16 before this chassis is mounted on the main chassis 15. In addition to the slot 26 in retainer 20, which receives the decoder chassis 16, a passage 27 is provided therein to clear the chip carrier 30 and cover 34. The die 32 can be a semiconductor having circuit conductors thereon designed to provide circuits which operate in different coding schemes. The conductors can be cut or open circuited to provide different circuit configurations, as is well known. The slot 28 in retainer 20 for passage of the code plug 22 may have an enlarged portion 29 aligned with the die 12, so that a laser can be directed therethrough to cut or open particular conductors and thereby program the same for the desired coding operation. As the portion 29 of slot 28 is accessible through the battery opening in the housing 10 when the cover 11 is removed, the programming of the die 32 can be performed when the pager is completely assembled and in operative condition.

Although the invention has been described for use in a radio pager, it is obvious that it can be used in other portable devices. For example, it can be used in a radio remote control unit which includes an energizing battery and a code plug for determining the particular code signal which is transmitted. Other portable devices with replaceable modules can also advantageously utilize the structure described. By use of this structure, the replaceable module can be inserted or extracted without any disassembly of the unit and without providing an additional opening in the housing. The battery opening and retainer, in addition to serving the normal function, further facilitate the insertion of the replaceable module and help hold the decoder chassis so that it remains in position during insertion and extraction of the module.

What is claimed is:

1. In a portable electronic device which includes a housing having an opening for receiving a battery for energizing the device, and which device is adapted for different operations and includes a removable module for controlling its operation, the combination including:
   retainer means within the housing for receiving the battery when inserted through the housing opening, said retainer means having an opening for receiving the module,
   connector means within the housing for receiving the module and making connections thereto, and
   support means for said connector means adjacent said retainer means for holding said connector means in position to receive a module inserted through the retainer means opening.

2. The combination of claim 1 wherein said battery receiving means is mechanically coupled to said support means for limiting movement thereof during insertion of the module into engagement with said connector means and during extraction thereof.

3. The combination of claim 1 wherein said connector means is a socket for making mechanical and electrical connections to the module, and said support means includes a chassis connected to said socket and having a circuit controlled by the module.

4. In a portable pager adapted to respond to a code and which includes a housing having an opening for receiving an energizing battery and a code plug for controlling the device so that it responds to a particular code, the combination including:
   retainer means within the housing for receiving a battery inserted through the housing opening,
   said retainer means having an opening for receiving the code plug,
   connector means within the housing for receiving the code plug and for connecting the same in operative relative in the pager, and
   support means for said connector means for holding the same in position to receive the code plug which is inserted through the housing opening and through said battery retainer means opening.

5. The combination of claim 4 wherein said support means includes a chassis connected to said connector means, and said retainer means is mechanically coupled to said chassis for limiting movement thereof.

6. The combination of claim 5 wherein said retainer means has portions extending about said chassis.

7. The combination of claim 5 wherein said connector means is a socket for making mechanical and electrical connections to the code plug.

8. The combination of claim 5 wherein said chassis includes a die which is programmable for use in different coding schemes, and said retainer means has an opening therein providing access to said die for programming the same.

9. The combination of claim 5 wherein said retainer means has portions defining a space for the battery, and the code plug is insertable through the opening in the housing and through the battery space in said retainer means into engagement with said connector means.

* * * * *

UNITED STATES PATENT AND TRADEMARK OFFICE
CERTIFICATE OF CORRECTION

PATENT NO. : 4,283,796
DATED : AUGUST 11, 1981
INVENTOR(S) : MARK FRANCIS HUGHES

It is certified that error appears in the above—identified patent and that said Letters Patent is hereby corrected as shown below:

In Column 1, line 26 delete elements and insert schemes.

In Column 1, line 58 delete paper and insert pager.

In Column 4, line 44 delete relative and insert relation.

Signed and Sealed this

Twentieth Day of October 1981

[SEAL]

Attest:

GERALD J. MOSSINGHOFF

*Attesting Officer*     *Commissioner of Patents and Trademarks*